(12) United States Patent
Chen et al.

(10) Patent No.: US 8,932,429 B2
(45) Date of Patent: Jan. 13, 2015

(54) ELECTRONIC KNOB FOR TUNING RADIAL ETCH NON-UNIFORMITY AT VHF FREQUENCIES

(75) Inventors: Zhigang Chen, Campbell, CA (US); Eric Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/594,768

(22) Filed: Aug. 24, 2012

(65) Prior Publication Data
US 2014/0054268 A1 Feb. 27, 2014

(51) Int. Cl.
*C23F 1/00* (2006.01)
*H01L 21/306* (2006.01)
*C23C 16/00* (2006.01)

(52) U.S. Cl.
USPC .................. 156/345.44; 118/723 E

(58) Field of Classification Search
USPC .................. 118/715, 722, 723 R, 723 E; 156/345.43–345.47
See application file for complete search history.

(56) References Cited

U.S. PATENT DOCUMENTS

| | | | | |
|---|---|---|---|---|
| 5,630,949 A | * | 5/1997 | Lakin | 216/61 |
| 5,733,511 A | * | 3/1998 | De Francesco | 422/186.05 |
| 2007/0236148 A1 | * | 10/2007 | Yamazawa et al. | 315/111.21 |
| 2007/0252529 A1 | * | 11/2007 | Belinger | 315/111.21 |

* cited by examiner

*Primary Examiner* — Maureen Gramaglia
(74) *Attorney, Agent, or Firm* — Martine Penilla Group, LLP

(57) ABSTRACT

System and methods for plasma processing of a wafer include a chamber with an electrode having a support surface and an outer edge region defined thereon. A radio frequency power is communicated to the electrode via a conductive delivery connection and returned through a conductive return connection. A capacitance is applied to a first end that causes appropriate capacitive adjustment and opposite impedance adjustment at a second end of the conductive delivery connection that is coupled to a dielectric surround structure that surrounds the electrode. The dielectric surround structure presents the opposite impedance adjustment near an outer edge of the electrode, such that increasing the capacitance at the first end causes a corresponding increase of impedance at the second end and a corresponding increase in voltage distribution near the outer edge region of the electrode that decreases toward a center of the support surface of the electrode.

12 Claims, 11 Drawing Sheets

ELECTRONIC KNOB FOR TUNING RADIAL ETCH NON-UNIFORMITY AT VHF FREQUENCIES

CROSS REFERENCE TO RELATED APPLICATIONS

This application is related to U.S. patent application Ser. No. 13/420,949, filed Mar. 15, 2012, entitled "Dual Zone Temperature Control of Upper Electrodes," U.S. patent application Ser. No. 13/438,473, filed Apr. 3, 2012, entitled "Multi Zone Gas Injection Upper Electrode System," and to U.S. patent application Ser. No. 13/403,760, filed Feb. 23, 2012, entitled "Peripheral RF Feed and Symmetric RF Return for Symmetric RF Delivery," the disclosures of which are incorporated herein by reference.

BACKGROUND

1. Field of the Invention

The present embodiments relate to wafer processing apparatus, and more particularly, apparatus and methods for processing a wafer in a plasma etching chamber.

2. Description of the Related Art

The manufacturing of integrated circuits includes exposing substrates (e.g., wafers) to chemically-reactive plasmas to etch features. The features are then processed to define transistors, capacitors, vias, trenches, etc. The vias and trenches are used for placing the conducting interconnectors.

Non-uniform etching can adversely impact wafer yield. The non-uniform etching can be attributed to electromagnetic standing wave effect that has been observed in the plasma reactor caused by the radio frequency (RF) electromagnetic waves used during the etching process. The electromagnetic standing wave effect has been noticed to result in the formation of strong center-high etch rate pattern within a plasma reactor, particularly at very high frequency of 30 MHz and above. The standing wave effect and, hence, the center-high etch rate pattern is found, in at least some cases, to be significant when the reactor diameter is comparable to half of the effective RF wavelength provided in the plasma reactor. It would be beneficial to control the non-uniformity in the etching process by addressing the standing wave effect within the plasma reactor, particularly as the size of the critical dimension shrinks with each new generation of devices, and as wafer sizes increase, so as to facilitate production of higher number of devices from the same wafer. Thus, controlling non-uniformity is crucial to enabling more advanced technology nodes to be mass produced in a cost-effective manner.

It is in this context that embodiments of the invention arise.

SUMMARY

Embodiments of the disclosure provide apparatus and methods for processing a wafer using RF power by using a variable capacitor at a RF match output. The capacitor is introduced at the interface between RF match and plasma processing apparatus. It should be appreciated that the present embodiments can be implemented in numerous ways, such as a process, an apparatus, a system, a device, or a method on a computer readable medium. Several embodiments are described below.

In one embodiment, a method for processing a wafer is provided. The method includes providing a chamber for plasma processing of the wafer. The chamber includes an electrode having a support surface and an outer edge region defined thereon. A radio frequency power is applied to the electrode of the chamber. The RF power is communicated to the electrode via a conductive delivery connection and a conductive return connection. The conductive delivery connection is sized to an effective electrical length that causes an impedance transformation at operating frequency. A capacitance is applied to a first end of the conductive delivery connection. The applied capacitance is adjustable so as to cause an opposite impedance adjustment at a second end of the conductive delivery connection. The second end is coupled to a dielectric surround structure that surrounds the electrode. The dielectric surround structure presents the opposite impedance adjustment near the outer edge region of the electrode, such that increasing the capacitance at the first end causes a decrease of capacitance and a corresponding increase of impedance at the second end. Increasing the impedance at the second end increases a voltage distribution near the outer edge region of the electrode that decreases toward a center of the support surface of the electrode.

In another embodiment, an apparatus for processing a wafer is disclosed. The apparatus includes a chamber for plasma processing of the wafer. The chamber is equipped with an electrode having a support surface and an outer edge region defined thereon. The apparatus also includes a radio frequency (RF) power source to provide RF power to the electrode through a conductive delivery connection and a conductive return connection. The conductive delivery connection is sized to an effective electrical length that causes an impedance transformation at an operating frequency. The RF power source includes a RF generator for generating the RF power, a RF match circuit coupled to the RF generator for optimizing delivery of the RF power from the generator to the wafer, and a variable capacitor coupled to the RF match circuit output so as to apply capacitance at a first end of the conductive delivery connection. The capacitance applied at the first end is adjustable so as to cause an opposite impedance adjustment at a second end of the conductive delivery connection. The second end of the conductive delivery connection is coupled to a dielectric surround structure surrounding the electrode. The dielectric surround structure presents the opposite impedance adjustment near the outer edge region of the electrode, such that increasing the capacitance at the first end causes a corresponding increase of impedance at the second end. Increasing the impedance at the second end increases a voltage distribution near the outer edge region of the electrode that decreases toward a center of the support surface of the electrode.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

Figure 1A:
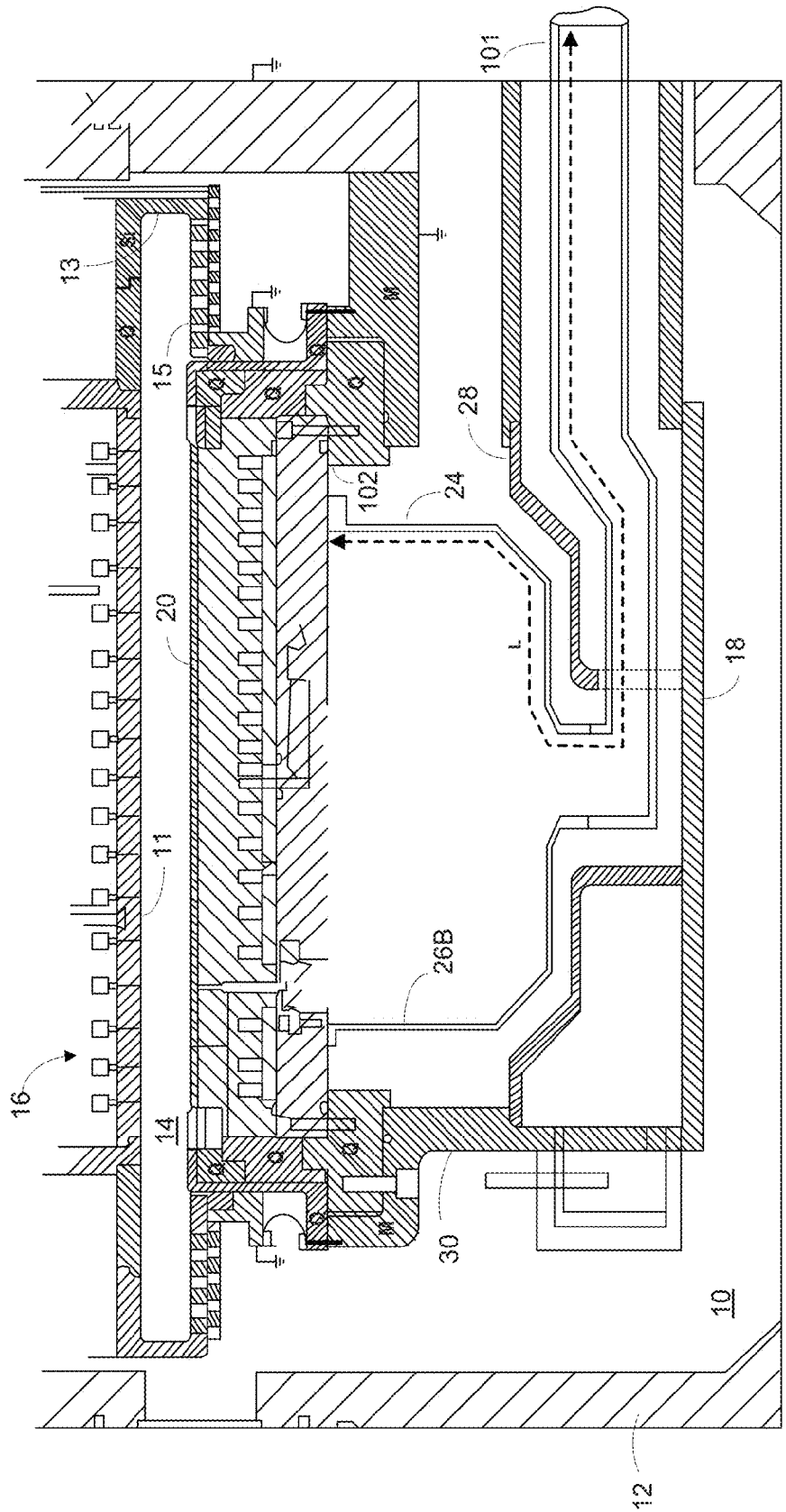
FIG. 1A illustrates a schematic cross section of a plasma reactor, in accordance with an embodiment of the invention.

The following embodiments describe apparatus and methods for processing a wafer in a plasma etching chamber supplied with RF power from an RF generator. It will be apparent that the present embodiments may be practiced without some or all of these specific details. In other instances, well known process operations have not been described in detail in order not to unnecessarily obscure the present embodiments.

Exciting an electric field between two electrodes is one of the methods to obtain RF gas discharge in an etching chamber. When an oscillating voltage is applied between the electrodes, the discharge obtained is referred to as a capacitive coupled plasma (CCP) discharge.

Plasma can be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from the walls and the surface of the wafer, to strike the wafer surface with enough energy to remove exposed material from the surface of the wafer.

In one embodiment, Fluorocarbon gases, such as $CF_4$ and $C-C_4F_8$, are used in the dielectric etch process for their anisotropic and selective etching capabilities, but the principles described herein can be applied to other plasma-creating gases. The Fluorocarbon gases are readily dissociated into smaller molecular and atomic radicals. These chemically reactive by-products etch away the dielectric material, which in one embodiment can be $SiO_2$ or SiOCH for low-k devices.

Briefly speaking, an RF generator provides the necessary RF power for the plasma etching chamber. The RF power from the RF generator is transmitted to a RF match circuit to cause an impedance that matches with the input impedance of the plasma chamber. The RF power output from the RF match circuit is applied to the wafer through a conductive delivery connection (otherwise termed RF delivery transmission line) and returned via a conductive return connection (otherwise termed RF outer return transmission line). In one embodiment, a variable capacitor is added at the RF match output at an input end of the RF delivery transmission line that causes the RF delivery transmission line to act as an impedance transformer. The variable capacitor is adjustable at the input end of the RF transmission line so as to cause an opposite impedance adjustment at a delivery end of the RF delivery transmission line. The tuning of the variable capacitor also causes variation in the impedance at the wafer level from high to low or from low to high and variation of the RF current phase at the wafer depending on the tuning. The transformation of the impedance and the current phase at the wafer level allows for formation of different electric field patterns over the wafer and control, e.g., shaping, or elimination of the center-high standing wave pattern. This control can be effectuated by providing a type of knob, which can electrically adjust the center-high standing wave pattern by adjusting the capacitance value. The electrical field patterns formed on the wafer play a critical role in determining ion flux distribution and the etch rate pattern on the wafer. The variable capacitor is, therefore, adjusted to enable formation of a more uniform electric field pattern over the wafer surface thereby defining an even ion flux distribution over the wafer surface.

The various embodiments, as will be described in greater detail, uses the existing RF circuitry and transmission line to provide a simple and effective electrical approach to assist in resolving possible non-uniformity etch pattern issues. In one embodiment, the change to a system can be small and can easily be integrated into an existing system. Alternate approaches of introducing external resonant inductor and capacitor circuit elements to address the non-uniform etch pattern issue caused significant power loss due to high circulating current. By contrast, the power loss due to the addition of the variable capacitor at the match circuit output, as disclosed herein, is minimal. The teachings of the current embodiments can be extended to address similar issues in any capacitively coupled plasma reactor operated at very high frequencies (VHF) in the order of between about 30-300 MHz.

In order to understand the various advantages of the invention, a plasma reactor that is used to process the wafer will now be described with reference to FIG. 1A. FIG. 1A illustrates a cross section of a plasma reactor, in accordance with an embodiment of the invention. The reactor includes a surrounding chamber 10 defined by a surrounding chamber wall 12, and a plasma confinement chamber 14 defined by a top electrode assembly 16 and a lower chuck assembly 18 that acts as a lower electrode. The chuck assembly 18 includes an electrostatic chuck (ESC) 20 having a substrate support surface on its top side for providing electrostatic clamping of a substrate to its substrate support surface and an outer edge region (or simply "outer region") defined at an outer perimeter of the substrate support surface. The ESC 20 is defined by a chuck assembly wall 30. Various facility components, such as components relating to heating, cooling, control of lift pins, and electrostatic clamping, are coupled to a facility plate (not shown), which, in turn, is coupled to the ESC 20 on a side opposite the substrate support surface. The bottom portion of the ESC is in the shape of a bowl.

As shown, the top electrode assembly 16 includes a showerhead 11 for feeding process gas into the plasma confinement chamber 14. The top electrode assembly also includes a shroud 13, which engages with the chuck assembly 18 to define the plasma confinement chamber 14. Perforations 15 are defined in the shroud 13 for gas flow exiting the plasma confinement chamber 14.

A hollow RF feed 24 is defined to provide RF power from a RF source to the substrate clamped to the substrate support surface. Accordingly, the hollow RF feed 24 includes a tubular portion extending from the RF source to a bottom end of the ESC assembly and a bowl-shaped portion extending upward from the tubular portion. The bowl-shaped portion of the RF feed 24 surrounds and conforms to the shape of the bowl-shaped portion of the ESC assembly. The first end of the tubular portion of the RF feed 24 is coupled to an RF match circuit of the RF source. A second end 102 defined in the bowl-shaped portion is coupled to the dielectric surround structure surrounding the ESC 20 so as to deliver RF power to wafer through the outer region of the ESC 20. For more information on providing RF power to the periphery of the ESC 20, reference can be made to U.S. application Ser. No. 13/403,760, entitled, "Peripheral RF Feed and Symmetric RF Return for Symmetric RF Delivery," filed on Feb. 23, 2012, which is incorporated herein by reference. Providing the RF power to the substrate from the periphery of the ESC enables bypassing the interior portion of the facility plate of the ESC, thereby insulating the components coupled to the facility plate, from the RF power. Additionally, such form of RF delivery to the substrate situated on the chuck assembly results in achieving high azimuthal uniformity.

The length "L" of the RF feed 24 extending from the first end 101 to the bowl-shaped portion of the RF feed 24 is sized to cause an impedance transformation at an operating frequency at the second end. In one embodiment, the size of the RF feed is about 1.25 meters, or about ¼ wavelength at 60 MHz. The size of the RF feed varies with varying frequency. The impedance transformation is transmitted to the outer ring area.

A ground shield 28 is provided to facilitate a substantially symmetric RF return. The ground shield 28, in one embodiment, is defined to surround the region of the hollow RF feed 24 extending from the first end of the tubular portion of the RF feed 24 to the bottom end of the bowl-shaped portion. The ground shield 28 is connected to ground circuitry through the ESC assembly wall 30.

Figure 1B:
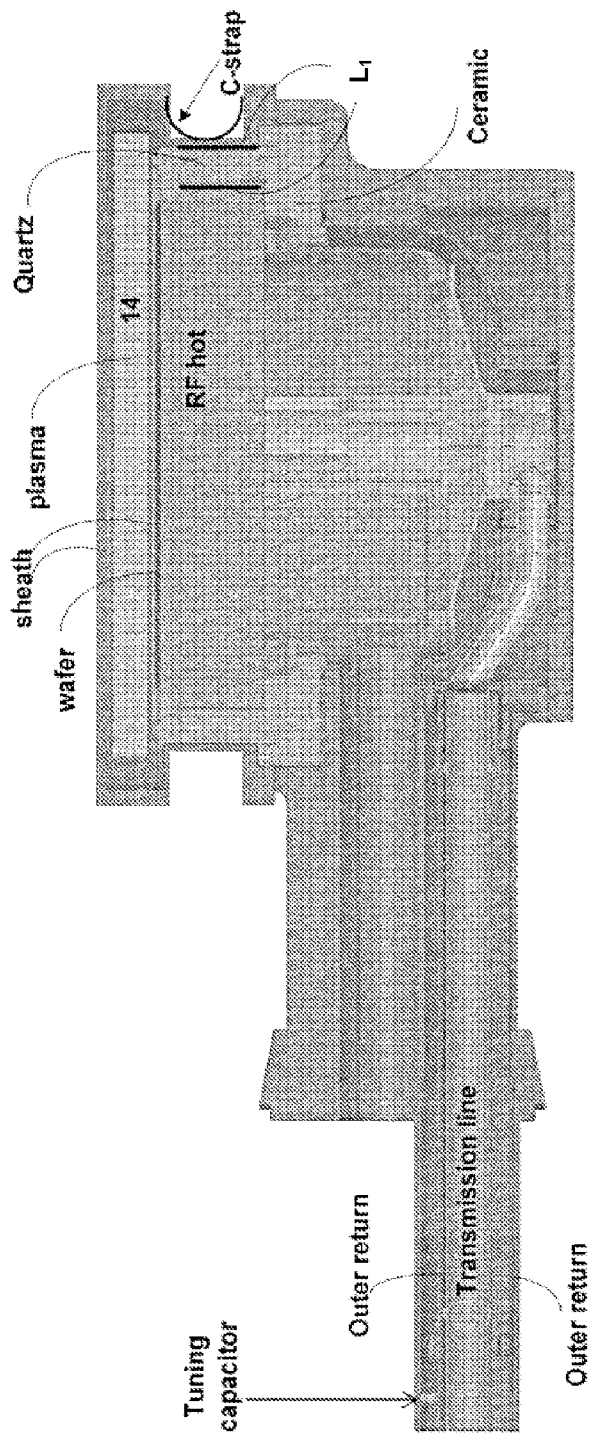
FIG. 1B illustrates a cross section of a plasma reactor chamber equipped with a variable capacitor, in one embodiment of the invention.

FIG. 1B illustrates a cross-section of the plasma reactor equipped with a variable capacitor for providing an adjustable capacitance at the first end of the RF feed 24 to cause an opposite capacitive adjustment at the second end of the RF feed 24, in one embodiment of the invention. As mentioned earlier, the RF feed 24 includes an inner transmission line and an outer return line for the RF power supplied by the RF source. The inner transmission line transmitting the RF power is termed "RF hot rod." The dielectric surround structure surrounding the bowl-shaped portion of the ESC assembly is composed of both ceramic and quartz components. For example, a quartz focus ring (not shown) is defined adjacent to the outer edge region (otherwise termed "outer ring") of the ESC 20 and coupled to the underlying quartz components. The underlying quartz components are, in turn, coupled to one or more ceramic components. The dielectric surround structure is connected to ground circuitry through the chamber wall 30. Additional grounding is provided to the electrode through a C-strap made of conductive material, such as copper or the like, connecting the electrode to the ground circuitry.

A plasma region is defined within a plasma confinement chamber 14 between the upper electrode and the ESC. A sheath 152 is formed between the plasma and the substrate support surface of the ESC/upper electrode. When the variable capacitor is tuned at the first end, the inner transmission line acts like an impedance transformer that transforms impedance at the wafer level from low to high or from high to low and the RF current phase at the wafer based on the capacitance value set at the variable capacitor. A pair of metal components provided on either side of the quartz elements with the dielectric surround structure of quartz and ceramic elements define the inductive element $L_1$.

Figure 2:
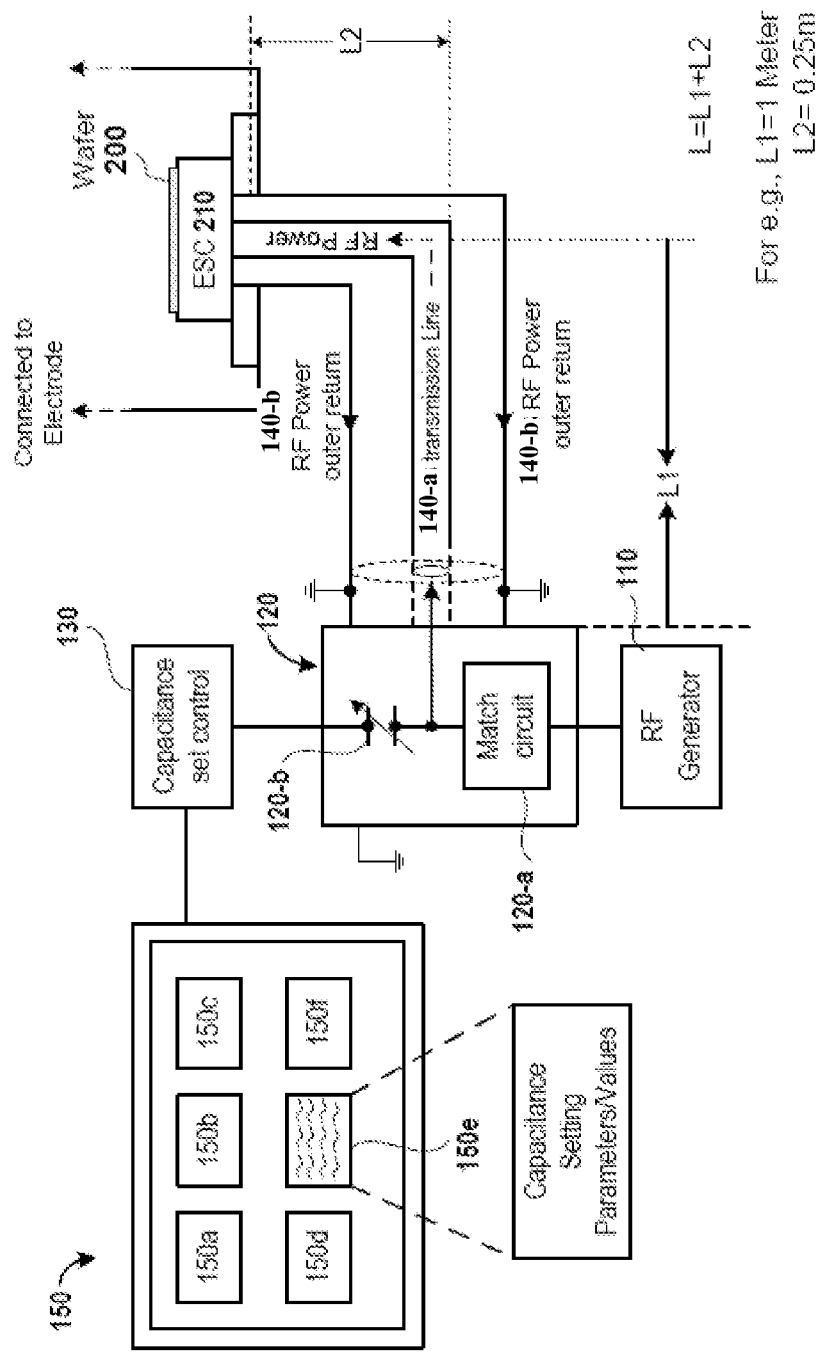
FIG. 2 illustrates an overall system identifying different components used for processing a wafer within a plasma processing chamber, in accordance with an embodiment of the invention.

FIG. 2 illustrates in more detail the RF delivery and return path to/from the plasma chamber, in one embodiment of the invention. As illustrated, the system includes a RF source for providing RF power to the plasma chamber. The RF source includes a RF generator 110 and a RF matching circuit box 120 for receiving the RF power and to provide a matching impedance prior to transmitting the RF power to the wafer on the substrate support surface. The match circuit box 120 includes a match circuit 120-a and a tunable capacitor 120-b that is connected between the match circuit 120-a and the RF feed 24 to apply a variable capacitance at the first end prior to transmitting the RF power through the RF feed 24. The match circuit within the matching circuit box 120 has an impedance that matches the internal impedance of the plasma chamber to an impedance of the RF generator. The RF power is transmitted to the wafer 200 disposed on the substrate support surface of the ESC 210 in the plasma chamber through the inner transmission line 140-a of the RF feed 24. The RF power is returned through an outer-return line 140-b that is coupled to the matching circuit box 120, which is connected to the ground circuitry to complete the return path circuit. The system also includes a computing device with a user interface 150, having a plurality of sub-interfaces. One of the sub-interfaces is a RF power input sub-interface 150a that controls the amount of RF power that is to be transmitted to the plasma chamber. Another sub-interface is a capacitance input interface 150b for adjusting the variable capacitor's parameters (for e.g., setting capacitance value). In one embodiment, the computing device is connected to a capacitance set control module 130, which, in turn, is coupled to the variable capacitor so as to adjust the capacitance value of the variable capacitor based on the input provided at the sub-interface 150b. The capacitance value on the variable capacitor may be adjusted mechanically or electronically. For example, in case of mechanical adjustment, the set control module 130 may include mechanism, such as motor mechanism, or at least controls to control the capacitance value of the variable capacitor. In addition to the RF power input sub-interface 150a and the capacitance input sub-interface 150b to adjust the variable capacitor's parameters, the user interface 150 may include additional sub-interfaces, 150c through 150f. The additional sub-interfaces may be used to control one or more parameters associated with the wafer processing including adjusting parameters of the feedstock gases that are used to generate plasma in the plasma chamber and/or to render the one or more of these parameters.

The RF generator receives input value from the RF power input sub-interface 150a and based on the input value generates the appropriate RF power for transmission to the plasma chamber. The matching circuit box provides matching impedance to match the impedance in the plasma chamber so as to minimize power reflections. A variable capacitor 120-b is coupled to the match circuit. The capacitance of the variable capacitor 120-b is varied based upon a capacitance set value received from the capacitance set control module 130. The capacitance set control module 130 receives input from the capacitance input interface 150b of the computing device to generate the capacitance set value. The capacitance value to be set for the variable capacitor 120-b is computed based on the RF power and the geometry of the RF feed 24, which is discussed in more detail with reference to FIG. 4. The adjusting of the capacitance at the first end results in corresponding adjustment to the capacitance and impedance at the second end. The adjusted impedance is transmitted to the outer edge region of the ESC. The impedance at the outer edge region causes voltage increase at the outer edge and the voltage reduces as the RF current moves through the plasma back to ground following two different RF return paths that encompasses the upper electrode, chamber wall, transmission line and the matching circuit.

Figure 3:
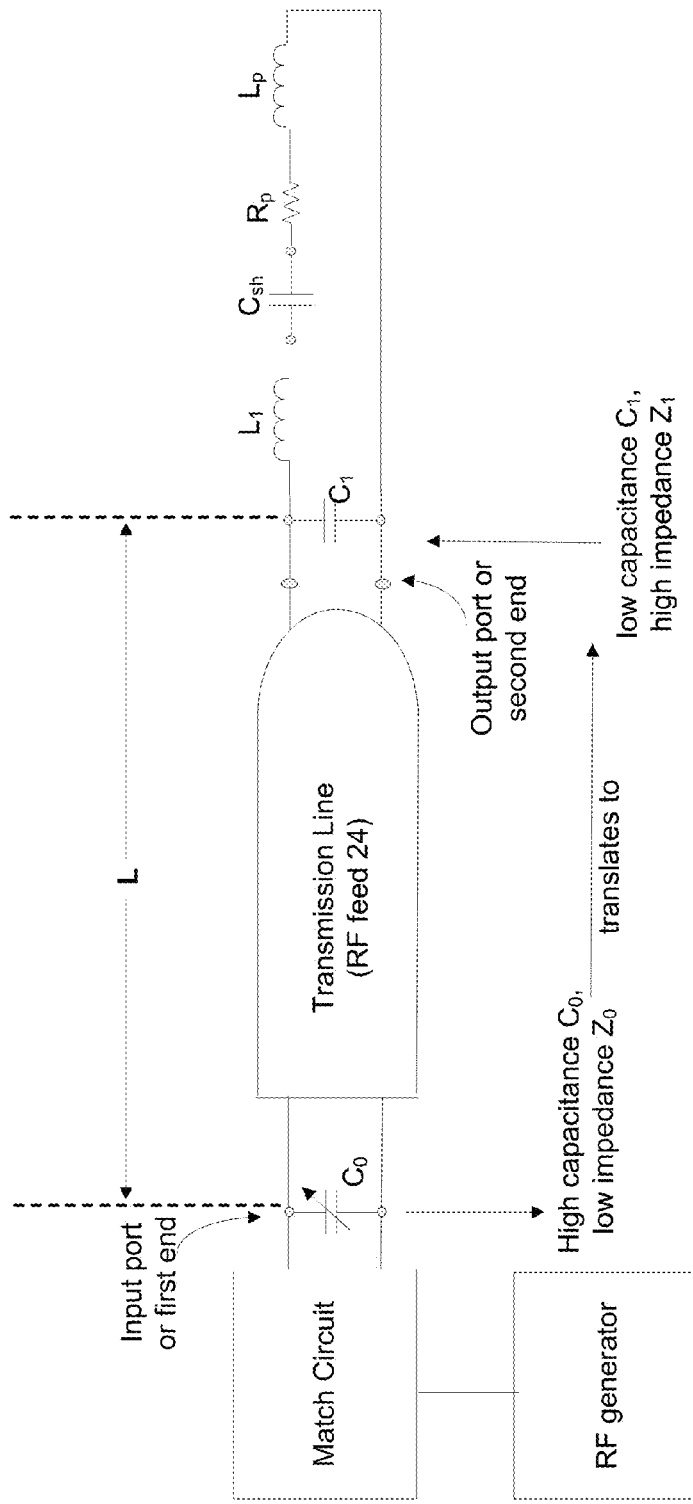
FIG. 3 illustrates schematic representation of an electric circuit identifying the various electrical components involved in the wafer processing using very high frequency RF power, in accordance with an embodiment of the invention.

FIG. 3 illustrates a simplified electrical circuit 300, which is a representation of the system illustrated in FIG. 2. Various elements of electrical circuit 300 will further be described with reference to FIG. 5. The variable capacitor 120-b of FIG. 2, is represented as a capacitive element $C_0$ of the electrical circuit 300. The capacitive element $C_1$ is representative of the opposite capacitive adjustment caused by adjusting the capacitance value $C_0$ of the variable capacitor 120-b. The inductive element $L_1$ is representative of inductance of the RF delivery and ground metal surface. Capacitive element $C_{sh}$ is representative of the capacitance exhibited by the sheath defined in the plasma chamber. Resistive element $R_p$ is representative of the resistance component of the plasma. Inductive element $L_p$ is representative of inductance of the plasma formed in the plasma chamber. As previously described, varying the capacitance value $C_0$ of the variable capacitor 120-b at the first end will result in an opposite capacitive adjustment value $C_1$ at the output capacitance disposed in the second end. For example, tuning the variable capacitor to a high capacitance value $C_0$ at the first end results in a low impedance $Z_0$ at the first end, a corresponding low capacitance value $C_1$ and high impedance $Z_1$ at the second end. The electrical circuit 300 is completed by the return path to the ground circuitry. The RF power follows two return paths to the ground circuitry. The first return path is through the chuck assembly wall 30, the ground shield 28 and the ground circuitry. The second path is through the plasma to the upper electrode, C-shroud and the ground circuitry through the insulation bulk of the dielectric surround structure.

The embodiments of the invention provide a way to adjust the impedance at the wafer level so as to cause uniformity or adjustment in the ion flux by minimally modifying the existing electrical circuit to introduce a variable capacitor at the output end of the match circuit. In one embodiment, in addition to introducing the variable capacitor to the output end of the match circuit, the length of the transmission line may be sized to an effective electrical length so as to cause impedance transformation at an operating frequency at the wafer level. The effective electric length "L", in one embodiment, depends on the RF frequency provided to the transmission line. For example, in one embodiment, optimal result has been observed when the tubular portion of the transmission line is curved/adjusted to about ¼ wavelength when the RF power provided at the transmission line is about 60 MHz. In one embodiment, the length of the tubular portion is about 1 meter and the size of the vertical portion surrounding the bowl-shaped portion is about 0.25 meters, for 60 MHz RF power. In another embodiment, the total length of the transmission line is about 1.25 meters for 60 MHz RF power. As mentioned earlier, the effective electrical length may vary depending on the RF frequency supplied through the transmission line.

Figure 4:
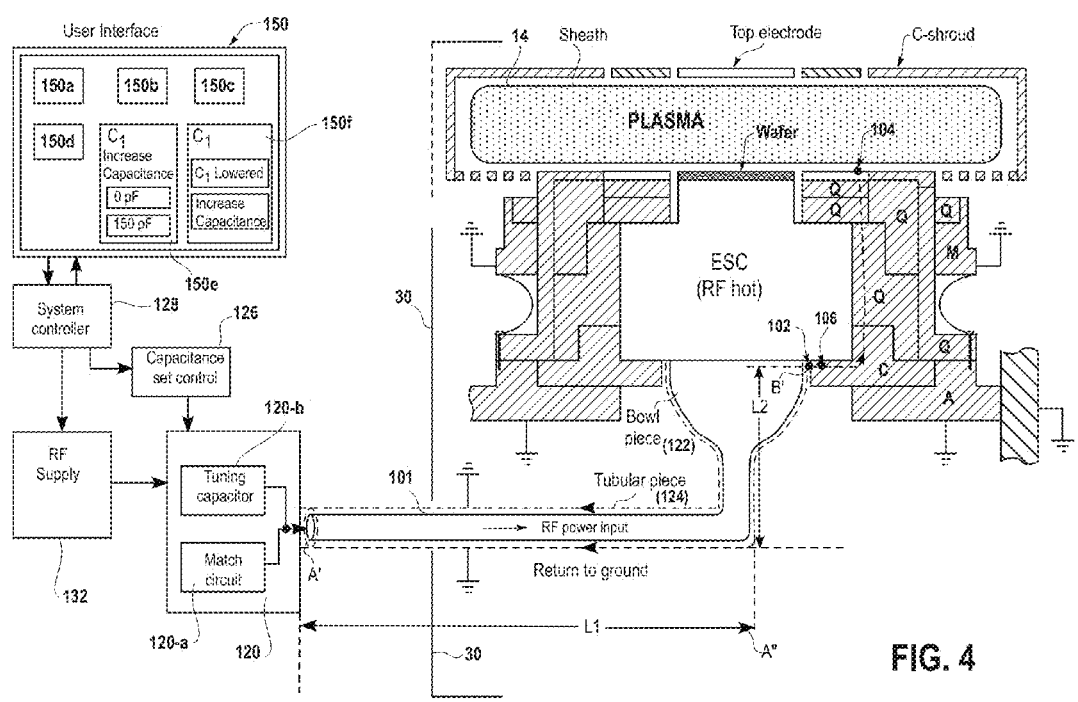
FIG. 4 illustrates a cross section of a plasma etching chamber connected to a computing system for adjusting RF power that is supplied to an electrode in the plasma etching chamber, in accordance with an embodiment of the invention.

FIG. 4 illustrates the various components of a system with a cross section of a plasma reactor contained therein that is used to provide high capacitance at a first end to cause high impedance at a second end and high voltage distribution near an outer edge of an electrode of the plasma reactor. As depicted, the plasma reactor is enclosed within a chamber. The plasma reactor is surrounded by a chamber wall of the chamber. A plasma confinement chamber is defined in the plasma reactor by a top electrode assembly and a lower electrostatic chuck assembly. The top electrode assembly includes a showerhead for feeding process gas into the confinement chamber and a shroud to engage the chuck assembly to define the plasma confinement chamber. The shroud includes perforations for process gas flow exiting the plasma confinement chamber.

The chuck assembly includes an electrostatic chuck providing a substrate support surface and an outer ring defined on the top side and various components coupled to the side opposite the substrate support surface of the ESC. The outer ring is defined around the periphery of the substrate support surface. The various components may include components related to heating, cooling, control of lift pins, electrostatic clamping, to name a few. The above list is exemplary and should not be considered restrictive. The ESC assembly is surrounded by dielectric surround structure that is made up of one or more of quartz elements, ceramic elements and alumina elements. The dielectric surround structure (also termed "insulation bulk") is connected to the grounding circuitry.

A hollow RF feed is coupled to a peripheral portion of the ESC assembly so as to deliver RF power to the outer ring of the ESC through the dielectric surround structure. The RF feed includes a bowl-shaped portion 122 and a tubular portion 124. The bowl-shaped portion 122 surrounds the ESC assembly conforming to the shape of the ESC assembly and the tubular portion is connected to the bottom of the bowl-shaped portion and extends laterally away from the ESC assembly to the chamber wall 30 of the plasma reactor. A first end 101 defined in the tubular portion 124 of the RF feed extending outside the chamber wall 30 is connected to a match circuit box 120 and the match circuit box 120 is coupled to a RF generator 132 such that the match circuit box 120 is between the RF generator 132 and the RF feed. The match circuit box 120 is connected up to the mechanical wall of the chamber 30 and is grounded by connecting to ground circuitry. The match circuit box houses a matching circuit 120-a and a tunable capacitor 120-b. The RF feed includes an inner transmission line and an outer wall. The inner transmission line is connected to the output from the match circuit box 120. The outer wall of the RF feed is connected to the ground circuitry to complete the RF return path.

A computer system is connected to the RF generator 132 to control and manage the RF power that is provided to the plasma reactor. The computer system is also connected to the match circuit box 120 through a capacitance set control module 126 to control tuning of the variable capacitor 120-b connected to the output end of the match circuit 120-a. The tuning may be mechanical (i.e. motor driven) or electronic and is based on the capacitance value input from the computer system through the capacitance set control module 126. The computer system may include a user interface 150 with a plurality of sub-user interfaces 150a-150f for controlling one or more attributes of the etch process performed in the plasma reactor chamber. The data for the interface may also be programmed based on a defined recipe. For example, sub-user interface 150b may be used to provide capacitance setting values to the capacitance set control module 126 that drives the motor to tune the variable capacitor in the match circuit box. It should be noted that once an optimal setting value is found for the variable capacitor, that optimal setting value is used during the whole etch process conducted in the chamber.

Alternatively, the setting can be adjusted during an etch cycle periodically, or at different phases of the etch process.

Figure 8:
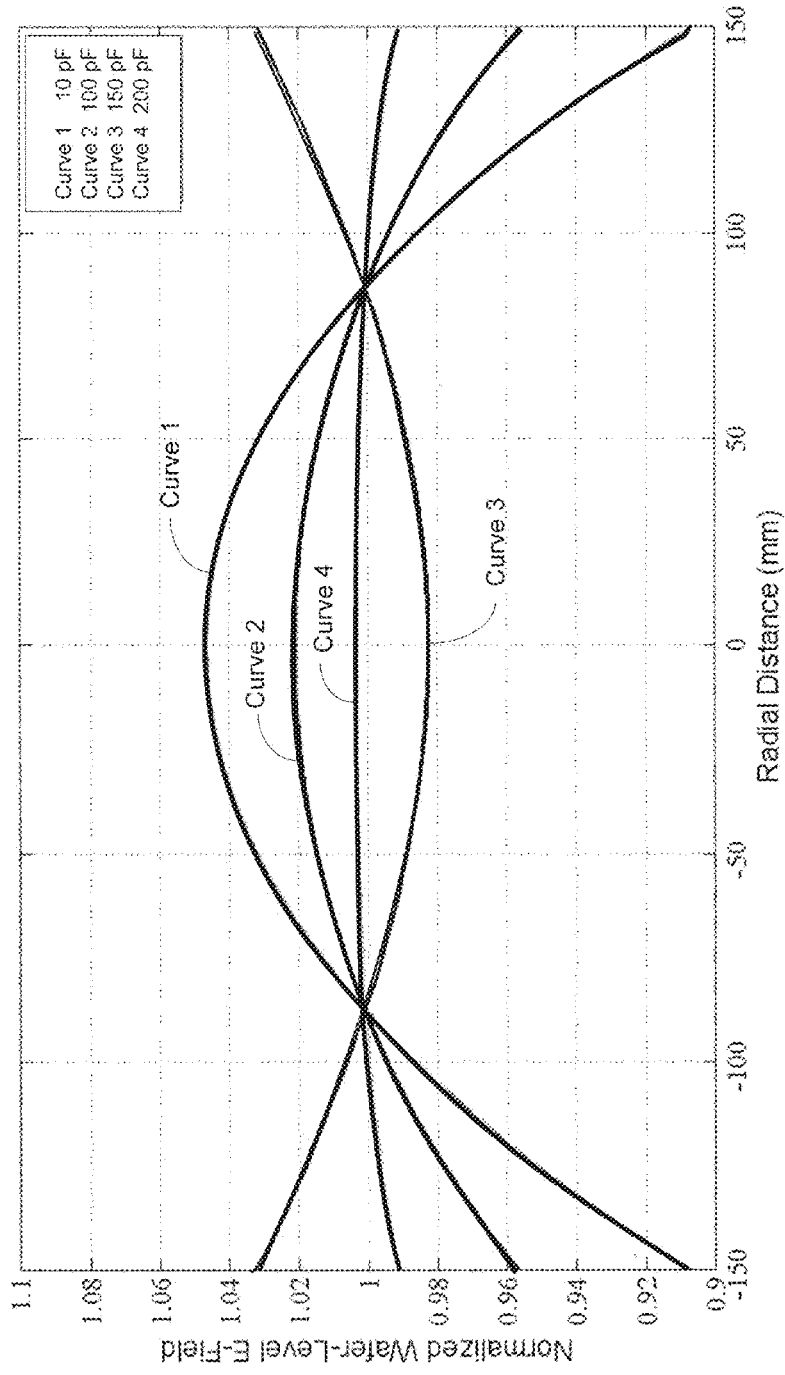
FIG. 8 represents a graph of radial dependence of electric field as a result of tunable capacitance, in one embodiment of the invention.

In conventional system where there is no variable capacitor provided in the match circuit box, the capacitance at the first end is low. As a result, impedance at the first end of the RF feed is high and the impedance across the insulation bulk represented by the dielectric surround structure is low. Due to the presence of low impedance at the exit area near the outer ring, there is low impedance to the current exiting the insulation bulk thereby causing the current to flow easily toward the chamber wall. This boundary condition effectively establishes a center-high electric field profile described by the $0^{th}$ order Bessel function of first kind [1] across the wafer, as shown by curve 1 of FIG. 8. The variation in the electric field pattern affects the etch rate pattern. Adjusting the RF power in order to provide a more even etch rate pattern would result in a modest reduction of the center-high electric field pattern, as illustrated by curve 2 of FIG. 8, but does not fully address the non-uniform etch rate pattern.

In order to control this non-uniformity in the etch rate, the impedance has to be increased across the insulation bulk to force an increase in the electric field and voltage at the edges. Since the insulation bulk is not an isolated insulator but an integrated part of the RF transmission line system, impedance can be adjusted at the second end by adjusting the capacitance at the first end of the RF feed. Adjusting the capacitance would cause the RF transmission line to behave like an impedance transformer transferring the low impedance at first end to high impedance at the second end and vice versa. A variable capacitor is added to the RF match circuit so as to adjust the capacitance at the first end prior to transmitting the RF power through the inner transmission line of the RF feed. The capacitance value $C_0$ of the variable capacitor at the first end 101 of the RF feed is increased using the user interface 150b. In one embodiment illustrated in FIG. 4, $C_0$ is increased from 0 pico Farads (pF) to about 150 pF. This causes the transmission line to convert into an impedance transformer resulting in low impedance $Z_0$ at the first end, corresponding low capacitance $C_1$ and high impedance $Z_1$ at the second end 102. The low capacitance $C_1$ and the high impedance $Z_1$ is carried across the insulation bulk to the exit point 104 at the outer ring. In one embodiment, the outer ring is essentially a focus ring that surrounds the substrate treatment region in the chamber. Due to the high impedance in the exit area between the exit point 104 at the outer ring and the chamber wall, the voltage and, hence, the electric field at the edge of the wafer is high and reduces as it spreads toward the center. The distribution of the voltage across the wafer surface is illustrated in FIG. 5.

Figure 5:
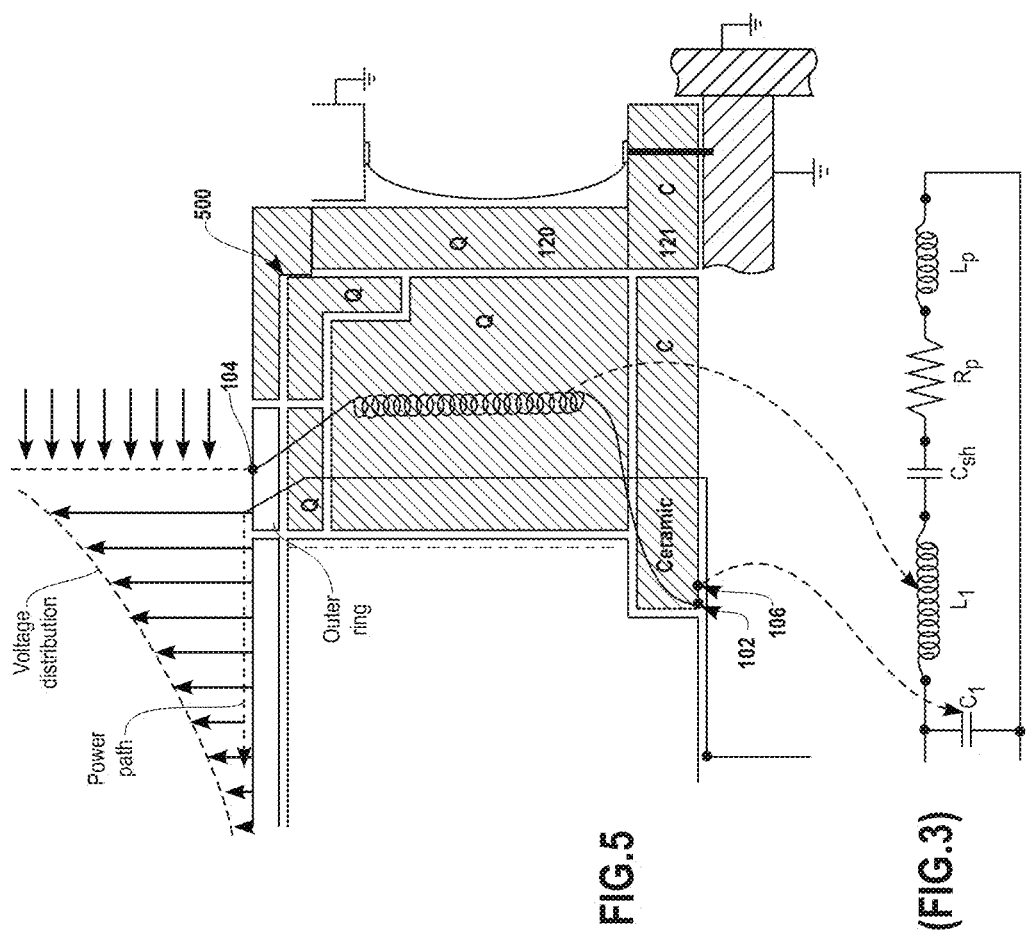
FIG. 5 illustrates the various components of the insulation bulk within the plasma reactor that correspond to the components of the electrical circuit of FIG. 3, in accordance with an embodiment of the invention.

Now referring to FIG. 5, the insulation bulk 500 of the plasma reactor is shown. Some of the elements of the electrical circuit 300 will be explained in relation to different elements of the insulation bulk. For example, the combination of conductive metal layers 120 and 106 with the insulation bulk in-between are part of the capacitive element $C_1$. The inductance of the metal layers is part of the inductive element $L_1$. The high capacitance $C_0$ applied at the first end causes low capacitance $C_1$ and higher impedance $Z_1$ at the insulation bulk that carries to the outer region of the ESC (i.e. electrode). The voltage exiting out of the insulation bulk at the outer region (i.e. periphery) of the support surface encounters the higher impedance at the outer region. The voltage and, hence, the electric field is high near the outer edge where the voltage exits the insulation bulk and reduces in intensity as it moves toward the center of the chamber. The voltage distribution is illustrated by the vertical arrows at the top portion of FIG. 5. The reduction in the intensity of the voltage across the wafer surface is represented by the reduction in the height of the vertical arrows from the edge toward the center of the chamber. The voltage distribution defined in this embodiment is represented by curve 3 in FIG. 8. The ideal goal is to attain a balanced voltage distribution in order to effectuate a more even electric field pattern at the wafer level, as illustrated by curve 4 in FIG. 8. The electrical field pattern, as mentioned earlier, drives the ion flux distribution and the etch rate pattern on the wafer surface.

In order to attain more balanced voltage distribution across the wafer surface, the variable capacitor is tuned at the first end. Balanced distribution of voltage would result in the formation of a more leveled electrical field pattern over the wafer surface, as shown by curve 4 in FIG. 8. In order to achieve the balanced distribution, in one embodiment, variable capacitor is tuned based on the RF power provided at the transmission line and on the effective electrical length of the transmission line. The effective electrical length, in one embodiment, is defined as a sum of the horizontal length "L1" and the vertical length "L2" of the RF feed. For example, the horizontal length of the RF feed is defined as the distance L1 of the tubular portion of the transmission line from the input end (i.e. first end, represented by A' in FIG. 4) where the transmission line is coupled to the match circuit box having the variable capacitor up to the bottom of the bowl-shaped portion of the RF feed, represented by A". The vertical portion of the RF feed is defined as the length L2 from the bottom of the bowl-shaped portion of the RF feed, represented by A", to the point 102, represented by B', in FIG. 4 where the RF power enters the insulation bulk. In another embodiment, the effective electrical length is defined as the length of the transmission line from the input end (i.e. first end) where the transmission line is coupled to the match circuit box having the variable capacitor to the second end where the RF power is supplied to the insulation bulk. In one embodiment, the geometry of the tubular portion of the transmission line is input to the user interface along with the proposed RF power and the computing device computes the tuning capacitor's range value that would result in balanced distribution of the voltage. In another embodiment, the effective electric length of the transmission line is input to the user interface along with the proposed RF power and the computing device computes the tuning capacitor's range value that would result in balanced distribution of the voltage at the wafer level. In one embodiment, for 60 MHz of RF power desirable distribution of the voltage has been observed when the capacitance set value computed by the computing device is between about 50 pico Farads (pF) to about 500 pF. A more desirable distribution of the voltage has been observed when capacitance value is between about 75 pF to about 300 pF and an optimal distribution of voltage has been observed when the capacitance value is set between about 100 pF to about 200 pF.

Figure 6:
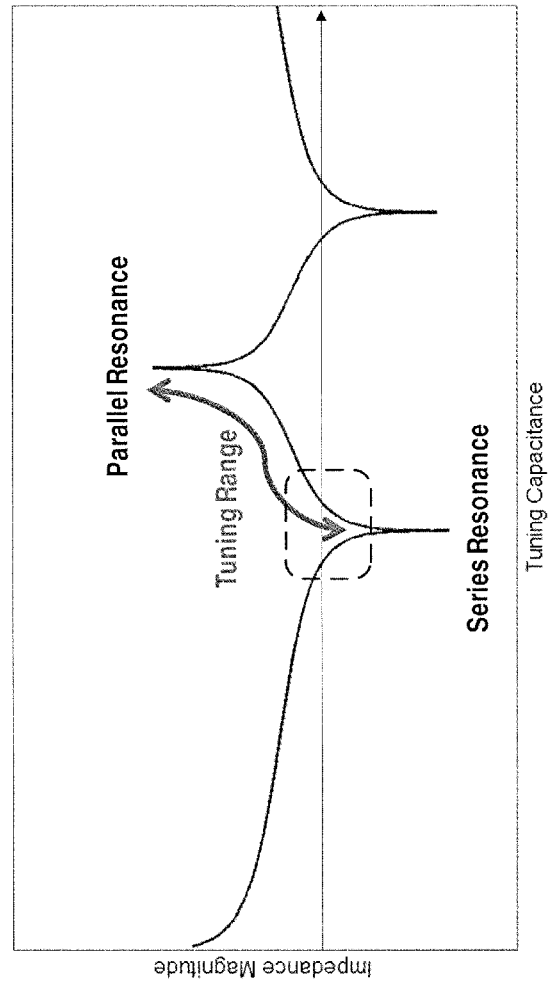
FIG. 6 illustrates effective transformation of impedance and capacitance/impedance value for optimal distribution of voltage across the wafer, in one embodiment of the invention.
Figure 7:
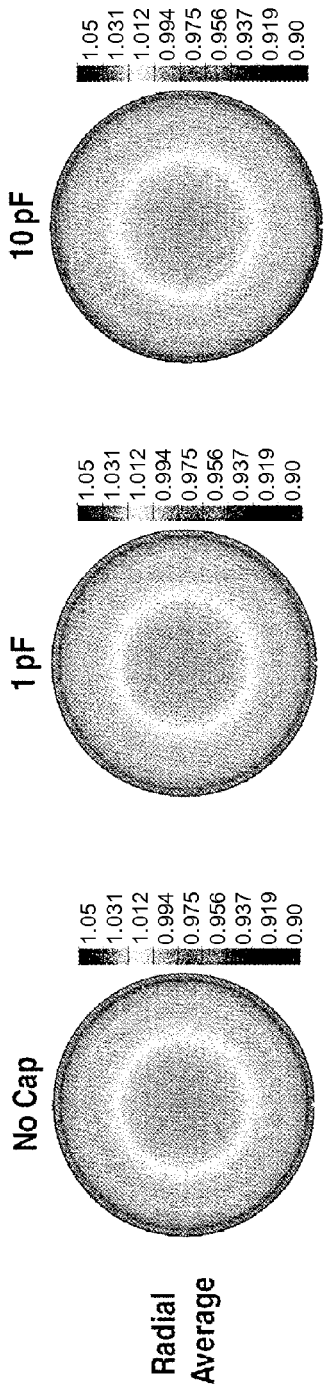
FIGS. 7a-7f illustrate electric field pattern at wafer level as a result of capacitance tuning, in one embodiment of the invention.

FIG. 6 illustrates effective transformation of capacitance/impedance value that provides optimal distribution of electric field/voltage across the wafer under the plasma. The boxed section represents the value of capacitance and the corresponding impedance used during processing of the wafer using conventional methods. The optimal value, in one embodiment of the invention, is illustrated by the curve segment between points A and B.

FIGS. 7a-7f illustrate the electric field pattern on the wafer level when the capacitance value ranges from 0 pF to about 200 pF. As can be seen from FIGS. 7a-7f, in one embodiment, the optimal electric field pattern and hence a uniform ion flux is achieved when the capacitance value is set at 150 pF when 60 MHz RF power is used. It should be noted that the optimal capacitance value is based on characteristics of the RF power used, the transmission line and the plasma properties. As a result, for different RF power and/or effective electrical length of the transmission line, the optimal capacitance value may be different.

In one embodiment, when the electrical length falls short or is longer then the effective electrical length, the electrical length is adjusted by adding either dielectric material or metal in the path. For example, in one embodiment, when the electrical length of the transmission line is longer than the effective electrical length, then dielectric material is added to reduce the electrical length of the transmission line. Similarly, when the electrical length of the transmission line is shorter than the effective electrical length, then appropriate metal may be added to increase the electrical length of the transmission line.

Figure 9:
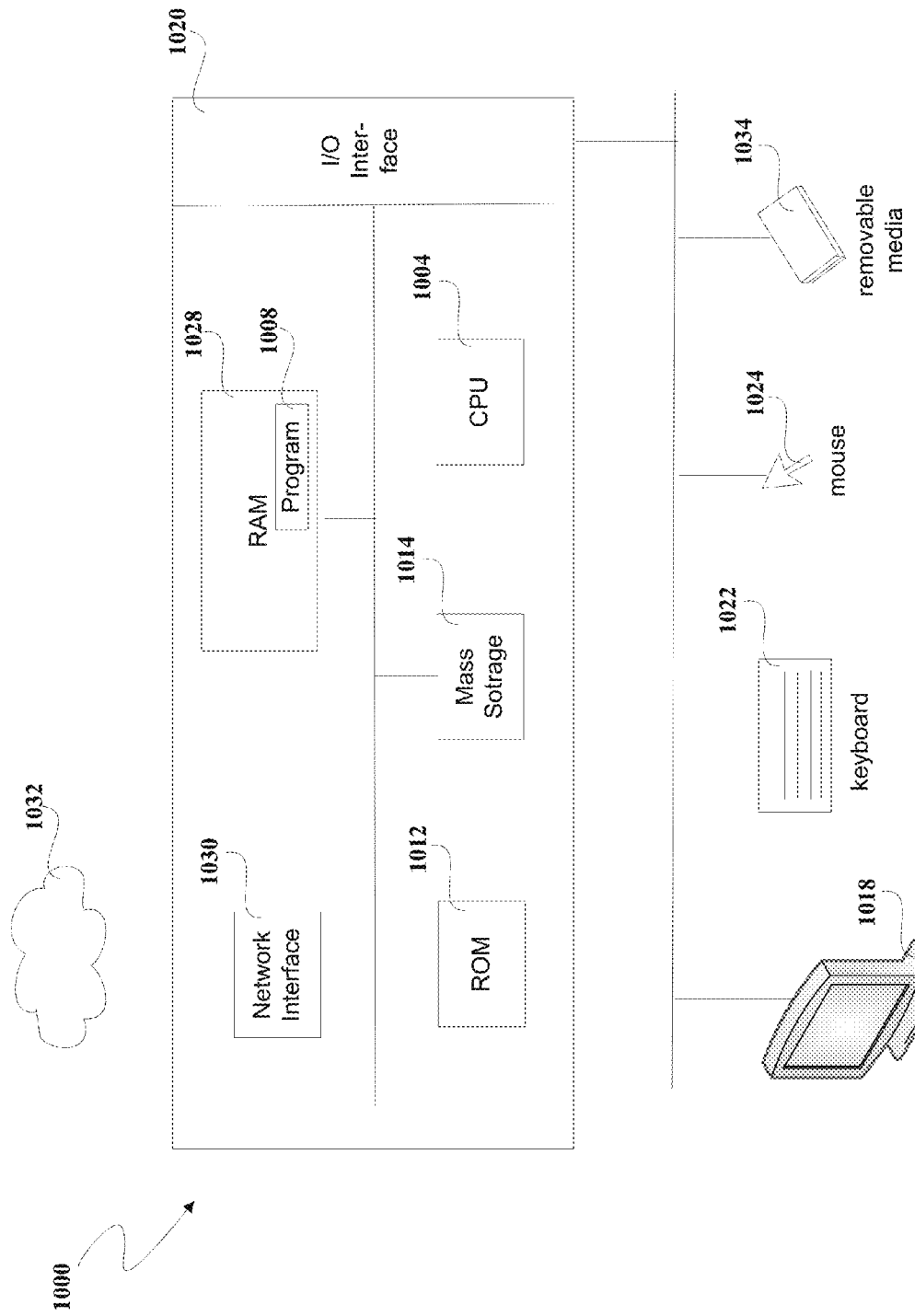
FIG. 9 is a simplified schematic diagram of a computer system for implementing embodiments described herein.

FIG. 9 is a simplified schematic diagram of a computing system for implementing embodiments described herein. It should be appreciated that the methods described herein may be performed with a digital processing system, such as a conventional, general-purpose computer system. Special purpose computers, which are designed or programmed to perform only one function, may be used in the alternative. The computer system includes a central processing unit (CPU) 1004, which is coupled through bus 1010 to random access memory (RAM) 1028, read-only memory (ROM) 1012, and mass storage device 1014. Capacitance control program 1008 as well as RF power control program resides in random access memory (RAM) 1028, but can also reside in mass storage 1014 or ROM 1012.

Mass storage device 1014 represents a persistent data storage device such as a floppy disc drive or a fixed disc drive, which may be local or remote. Network interface 1030 provides connections via network 1032, allowing communications with other devices. It should be appreciated that CPU 1004 may be embodied in a general-purpose processor, a special purpose processor, or a specially programmed logic device. Input/Output (I/O) interface provides communication with different peripherals and is connected with CPU 1004, RAM 1028, ROM 1012, and mass storage device 1014, through bus 1010. Sample peripherals include display 1018, keyboard 1022, cursor control 1024, removable media device 1034, etc.

Display 1018 is configured to display the user interfaces described herein. Keyboard 1022, cursor control 1024, removable media device 1034, and other peripherals are coupled to I/O interface 1020 in order to communicate information in command selections to CPU 1004. It should be appreciated that data to and from external devices may be communicated through I/O interface 1020. The embodiments can also be practiced in distributed computing environments where tasks are performed by remote processing devices that are linked through a wire-based or wireless network.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

Figure 10:
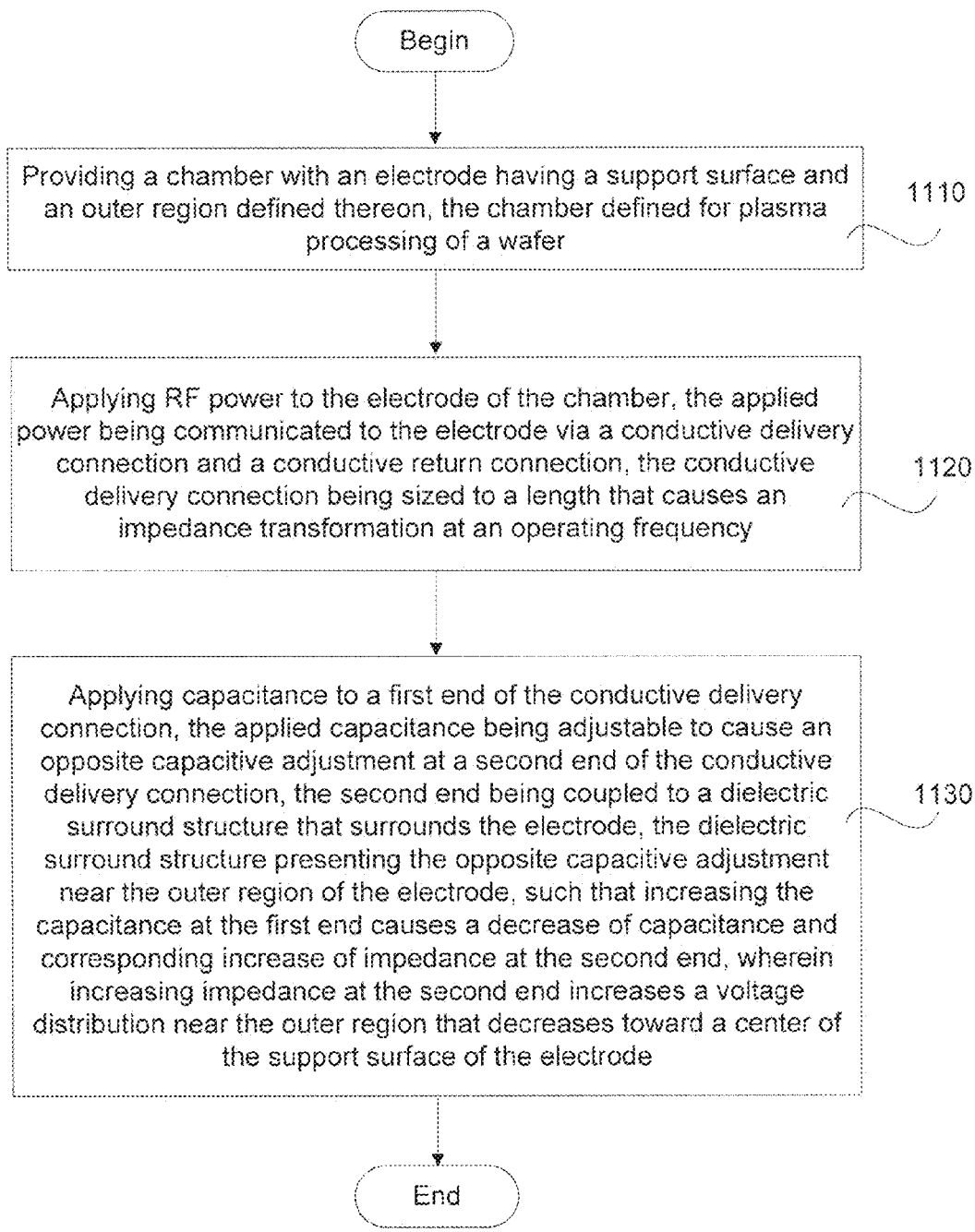
FIG. 10 illustrates a flow chart of various operations involved in providing optimal distribution of voltage across the wafer within a plasma chamber, in one embodiment of the invention.

With the aforementioned detailed description of various embodiments, a method for processing a wafer in a chamber will now be described with reference to FIG. 10. FIG. 10 illustrates the various process operations involved in processing a wafer in a plasma etch chamber using very high frequency RF power. The process begins at operation 1110 wherein a chamber with an electrode having a support surface and an outer region defined thereon, is provided. The chamber is defined for plasma processing of a wafer. An RF power is applied to the electrode of the chamber, as illustrated in operation 1120. The applied RF power is communicated to the chamber through a conductive delivery connection and returned through a conductive return connection of a RF feed. The conductive delivery connection is sized to a length that causes optimal impedance transformation at an operating frequency.

A capacitance is applied at a first end of the conductive delivery connection and adjusted so as to cause an opposite capacitive adjustment at a second end of the conductive delivery connection, as illustrated in operation 1130. The second end of the conductive delivery connection is coupled to a dielectric surround structure that surrounds the electrode. The opposite capacitive adjustment provided at the second end is presented by the dielectric surround structure near the outer region of the electrode. The opposite capacitive adjustment at the second end and the outer region causes a decrease of capacitance and a corresponding increase of impedance at the wafer level when capacitance is increased at the first end. Increasing the impedance at the second end and, hence, at the outer region causes increase in voltage distribution near the outer region. The voltage distribution decreases toward the center of the support surface of the electrode as the voltage moves away from the outer region/chamber wall due to the impedance.

Thus, the various embodiments of the invention provides an easy and efficient way of controlling the current phase at the wafer by introducing a variable capacitor to the system and making use of existing RF transmission line from the match output to the wafer. Adjusting the variable capacitor causes the transmission line to act as an impedance transformer. The change to the existing system is small and compatible with the system and the power loss due to the integration of the variable capacitor is negligible. The transformation of the impedance and, hence, the current phase at the wafer level allows for the formation of different electric field patterns at the wafer level and can eliminate the center-high standing wave pattern. The ion flux distribution and, therefore, the etch rate pattern due to the formation of different electric field patterns results in substantial yield saving at the wafer.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:
1. An apparatus for processing a wafer, comprising:
a chamber for plasma processing of the wafer, the chamber having an electrode assembly that includes a support surface and an outer edge region surrounding the support surface;

a radio frequency (RF) power source for providing RF power to the electrode assembly;

a matching circuit coupled to the RF power source;

an RF power connection structure coupled between the electrode assembly and an output of the matching circuit, the RF power connection structure including a conductive delivery connection to deliver the RF power to the electrode assembly and a conductive return connection for returning at least some of the RF power from the electrode assembly back to the output of matching circuit, the RF power connection structure having a length, a first end, and a second end, the first end coupled to the output of the matching circuit and the second end coupled to the electrode assembly, the length is set for an operating frequency, such that the length enables impedance transformation between the first end and the second end; and a variable capacitor connected between an output of the matching circuit and the first end of the RF power connection structure, the variable capacitor is not coupled to an inductor to define a resonant circuit at the output of the matching circuit.

2. The apparatus of claim 1, wherein the length is about ¼ wavelength of the operating frequency.

3. The apparatus of claim 2, wherein the operating frequency is 60 MHz.

4. The apparatus of claim 1, further includes a capacitor set control module coupled to the variable capacitor to control tuning of the variable capacitor.

5. The apparatus of claim 4, wherein the capacitor set control module is coupled to a capacitance-setting user interface of a computing system to electronically adjust the tuning of the capacitance at the first end.

6. The apparatus of claim 1, wherein changes in the variable capacitor at the first end produces a change in impedance at the first end and an opposite change in impedance at the second end.

7. An apparatus for processing a wafer, comprising:

a chamber for plasma processing of the wafer, the chamber having an electrode assembly that includes a support surface and an outer edge region surrounding the support surface;

a radio frequency (RF) generator for providing RF power to the electrode assembly within the chamber;

a matching circuit coupled to the RF generator to provide a matching impedance to the RF power;

an RF power connection structure coupled between the electrode assembly and an output of the matching circuit, the RF power connection structure including a conductive delivery connection to deliver the RF power to the electrode assembly and a conductive return connection for returning at least some of the RF power from the electrode assembly back to the output of the matching circuit, the RF power connection structure having a length, a first end, and a second end, the first end coupled to the output of the matching circuit and the second end coupled to the electrode assembly, the length is set for an operating frequency, such that the length enables impedance transformation between the first end and the second end; and a tunable capacitor disposed between an output of the matching circuit and the first end of the RF power connection structure, wherein changes in the tunable capacitor at the first end produces a change in impedance at the first end and an opposite change in impedance at the second end and wherein the tunable capacitor at the output of the matching circuit is not part of a resonant circuit.

8. The apparatus of claim 7, further includes a computing device that is communicatively connected to the RF generator and the tunable capacitor, the computing device configured to electronically control RF power supplied by the RF generator to the electrode assembly and to electronically adjust a capacitance value provided by the tunable capacitor at the first end.

9. The apparatus of claim 7, further includes a capacitance adjusting mechanism to control capacitance value of the tunable capacitor.

10. The apparatus of claim 7, wherein the length between the first end and the second end is adjusted by addition of a dielectric material or a conductive metal to a path defined by the conductive delivery connection so as to conform with an effective electrical length, when the length of the conductive delivery connection is greater or less than the effective electrical length, wherein the effective electrical length enables optimal impedance transformation at the operating frequency of the conductive delivery connection.

11. The apparatus of claim 10, wherein the effective electrical length of the conductive delivery connection is about ¼ wavelength of the operating frequency for RF power of 60 MHz.

12. The apparatus of claim 10, wherein the tunable capacitor is configured to set the capacitance at the first end to be between about 50 pico Farads (pF) and about 500 pF.

* * * * *